(12) United States Patent
Szabo et al.

(10) Patent No.: US 10,201,093 B2
(45) Date of Patent: Feb. 5, 2019

(54) VARIABLE WIDTH PRINTED CIRCUIT BOARD USING SURFACE MOUNT TECHNOLOGY JUMPERS

(71) Applicant: GE LIGHTING SOLUTIONS, LLC, East Cleveland, OH (US)

(72) Inventors: Zoltan Szabo, Budapest (HU); Katalin Eszter Horvath, Budapest (HU); Andras Majoros, Budapest (HU)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 15/409,591

(22) Filed: Jan. 19, 2017

(65) Prior Publication Data

US 2017/0290159 A1 Oct. 5, 2017

Related U.S. Application Data

(60) Provisional application No. 62/315,209, filed on Mar. 30, 2016.

(51) Int. Cl.
*H05K 3/22* (2006.01)
*H05K 1/02* (2006.01)
*H05K 1/14* (2006.01)
*H05K 3/00* (2006.01)

(52) U.S. Cl.
CPC ............... *H05K 3/222* (2013.01); *H05K 1/02* (2013.01); *H05K 1/0286* (2013.01); *H05K 1/14* (2013.01); *H05K 1/142* (2013.01); *H05K 3/0052* (2013.01); *H05K 2201/0909* (2013.01); *H05K 2201/09063* (2013.01); *H05K 2201/09445* (2013.01); *H05K 2201/10022* (2013.01); *H05K 2201/10106* (2013.01); *H05K 2201/10363* (2013.01)

(58) Field of Classification Search
CPC .. H05K 1/02; H05K 2201/09445; H05K 1/14; H05K 1/0286
USPC ............... 361/748, 767, 768, 784, 792, 803; 174/250
See application file for complete search history.

(56) References Cited

U.S. PATENT DOCUMENTS

| 9,228,732 B2 | 1/2016 | Li |
| 9,232,663 B2 | 1/2016 | Dingemans et al. |
| 2006/0050505 A1 | 3/2006 | McCarthy et al. |
| 2012/0026699 A1* | 2/2012 | Hsu ..................... H01R 12/732 361/749 |

FOREIGN PATENT DOCUMENTS

| JP | 2004-228291 A | 8/2004 |
| JP | 2014-150159 A | 8/2014 |
| KR | 10-1505452 B1 | 3/2015 |

* cited by examiner

*Primary Examiner* — Binh Tran
(74) *Attorney, Agent, or Firm* — Peter Th. DiMauro; GE Global Patent Operation

(57) ABSTRACT

Provided is a master printed circuit board (PCB). The master PCB includes panels defined by grooves cut in the master PCB, the grooves separating one panel from another. A final PCB is formable via use of one or more jumpers, wherein the jumpers are configured to extend across at least one of the grooves to electrically connect one panel to another panel. The electrically connected panels form the final PCB.

13 Claims, 8 Drawing Sheets

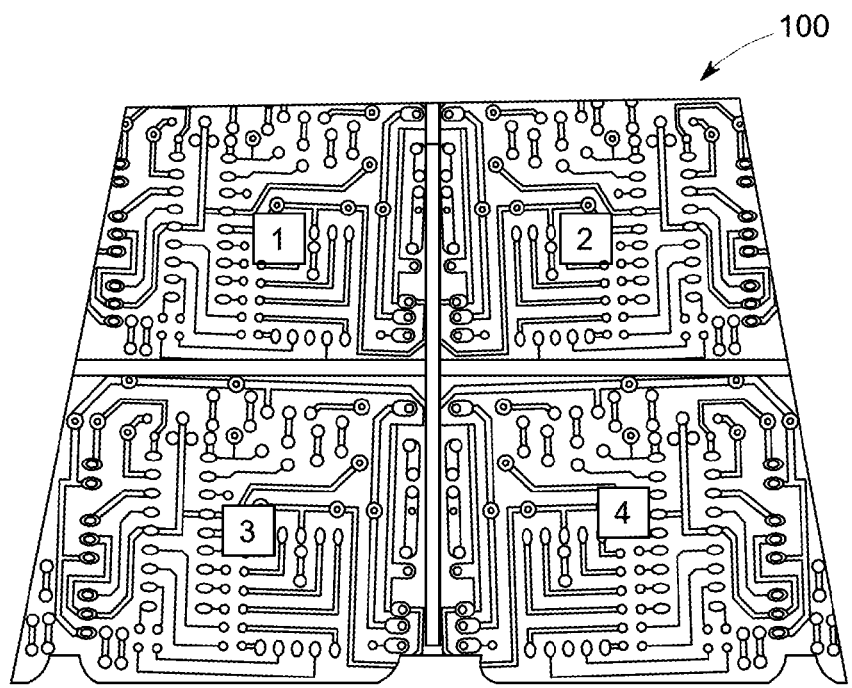
(Conventional)
FIG. 1A
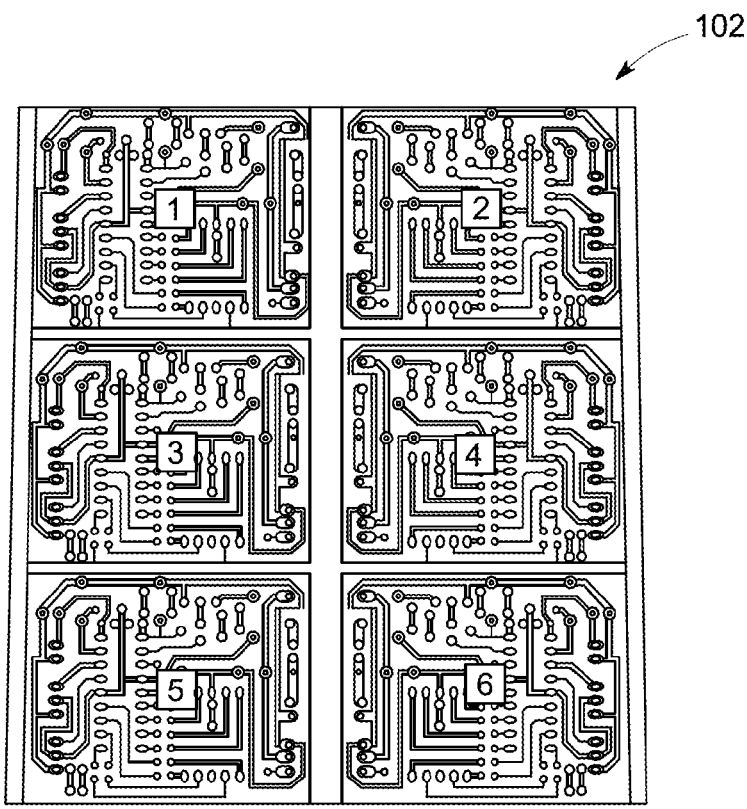
(Conventional)
FIG. 1B

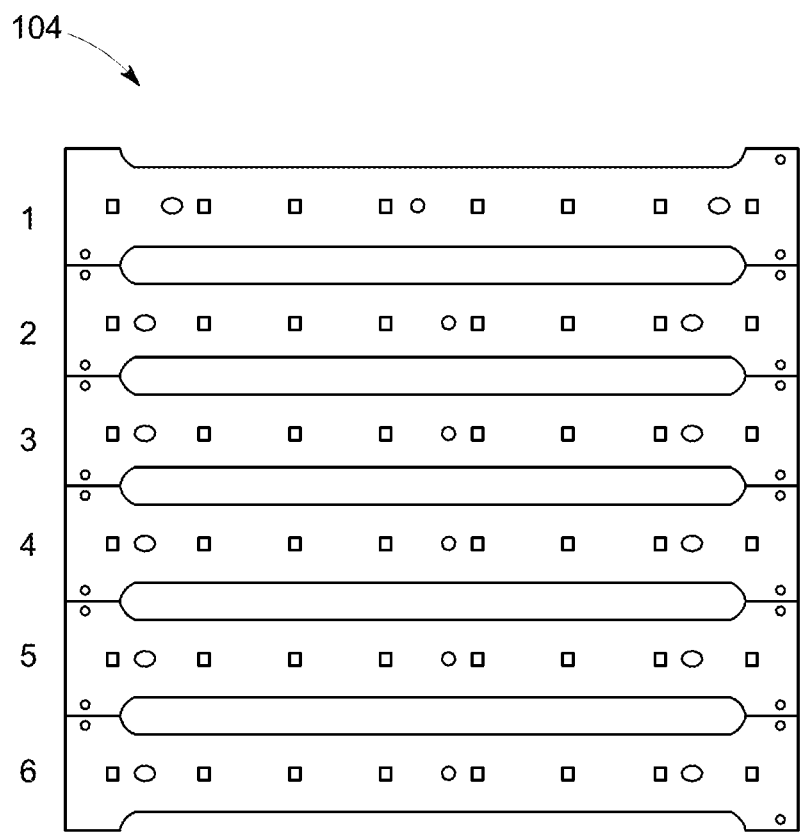
(Conventional)
FIG. 1C

… (1)

VARIABLE WIDTH PRINTED CIRCUIT BOARD USING SURFACE MOUNT TECHNOLOGY JUMPERS

CROSS-REFERENCE

The present invention is a non-provisional application claiming priority to provisional application No. 62/315,209, filed on Mar. 30, 2016, incorporated by reference herein in its entirety.

I. TECHNICAL FIELD

The present invention relates generally to master printed circuit board (PCB) assemblies. In particular, the present invention relates to electrically connecting final PCB assembly panels constructed from master PCBs.

II. BACKGROUND

Traditional PCB manufacturing techniques include a number of known panelization concepts. These SMT panelization concepts enable the PCBs to be broken into smaller sections or panels to form individual printed circuit arrays. As understood by those of skill in the art, a number of different panelization concepts control the manner in which PCBs are constructed to form the smaller panels or sections. These smaller panels and sections are created by constructing master PCBs to include cuts, grooves, or perforations along which the master PCB can be broken were separated to form the final PCB panels.

Conventional PCBs, normally restricted in size, are typically cut using special techniques that provide individual PCBs of optimal sizes. These techniques, such as V-cutting as an example, form the cuts, grooves, or perforations for where the PCBs can be separated to form the final panels or sections on which electrical components can be placed. As noted, these cutting techniques are conventional and well known to those of skill in the art. Other aspects of PCB manufacture, though conventional, are less precise.

For example, to provide optimally sized PCBs, a number of different master PCBs are typically constructed in different sizes. Each of the different sizes has different sized sections to accommodate different customer and product requirements. This approach, however, can be costly and inefficient. Additionally, providing the electrical connectivity between the various final PCB panels or sections, to form operable circuits, can also be costly.

One approach, for example, is to provide copperplating (i.e., trace material) within, and along the side of the PCB to provide the required electrical connectivity. This approach, however, multiplied across numerous master PCBs of differing sizes can add still additional costs and complexities. Also, the use of traces introduces vulnerabilities because of their susceptibility to damage.

III. SUMMARY OF THE EMBODIMENTS

Given the aforementioned deficiencies, a need exists for solutions for manufacturing PCBs that include simpler approaches for providing electrical connectivity between individual PCB final panels and sections. Solutions, for example, using small surface-mount technology (SMT) jumpers to connect one PCB section to another PCB section, are needed. A need also exists for providing electrically connectable PCB sections formed from master PCBs of a single size.

Embodiments of the present invention provide PCB assemblies configured for being sliced at predefined locations using simple slicing techniques while enabling electrical connections between various sections prior to slicing. In the embodiments, instead of using complex materials or methods of cutting through electrical connections, the connection is made with a simple SMT jumper above the V-cut, when sections are staying together. The jumper is not used when the sections are separated.

In the embodiments, instead of constructing the PCBs in different sizes, a single "one size fits all" approach can adopted for constructing the master PCBs. The conventional cuts (e.g., V-cuts), grooves, or perforations, common to PCB manufacture, can be used to break the PCB into a variety of smaller modularized segments. The individual PCB segments can be electrically connected via one or more small jumpers, discussed in greater detail below.

Under certain circumstances, embodiments of the present invention provide a master printed circuit board (PCB). The master PCB includes panels defined by grooves cut in the master PCB, the grooves separating one panel from another. A final PCB is formable via use of one or more jumpers, wherein the jumpers are configured to extend across at least one of the grooves to electrically connect one panel to another panel. The electrically connected panels form the final PCB.

Embodiments of the present invention facilitate use of a common base material to produce a large variety of final PCB products. For PCB assemblies, this approach not only provides for a variety of components, but also provides for a wide variety of physical sizes. For example, master PCBs can be precut at previously defined V-cut positions to final PCBs. By placing a jumper, such as a resistor, over the V-cut, the electrical connection can be created. For example, one jumper pad (e.g., leg) is connected on one side of the V-cut and another jumper pad is connected on the other side of the V-cut.

In this manner, electrical connections can be formed between the two final PCB sections. Since the electrical connection is formed at the assembly level, both serial and parallel connections can be accommodated. This unique approach provides greater flexibility of PCB design. In some embodiments, for example, serial or parallel connection configurations can be selected via a simple pick and place programming file change.

In the various illustrious embodiments, having a high volume of a single size master PCBs, along with the ability to have different size final PCBs and electrical connection options, enables optimized management of material inventory. A byproduct of this optimized management is the achievement of faster lead times. Having higher base PCB material volumes reduces overall product costs.

The embodiments can also reduce overall product validation times. This reduction occurs by using the same PCB building blocks on the final product level. Additionally, an enabled design flexibility of series-parallel connections, without having to wire from board to board with different connectors and or soldering, is provided. Increased reliability and overall reduction in manufacturing complexity is also provided.

Other embodiments can substitute any 2-pad component, such as a light-emitting diode (LED), to connect the two PCB sections together. Also, instead of using an SMT component, a board to board side clip, with electrical contacts, can be used to make the electrical connection. Still other embodiments provide the section to section electrical connection using through-hole resistors or soldered wire.

Additional features, modes of operations, advantages, and other aspects of various embodiments are described below with reference to the accompanying drawings. It is noted that the present disclosure is not limited to the specific embodiments described herein. These embodiments are presented for illustrative purposes. Additional embodiments, or modifications of the embodiments disclosed, will be readily apparent to persons skilled in the relevant art(s) based on the teachings provided.

IV. BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are for purposes of illustrating the embodiments and are not to be construed as limiting the disclosure. Given the following enabling description of the drawings, the novel aspects of the present disclosure should become evident to a person of ordinary skill in the relevant art(s).

FIG. 1A is a schematic illustration of mechanical aspects of a first conventional master printed circuit board (PCB).

FIG. 1B is a schematic illustration of mechanical aspects of a second conventional master PCB.

FIG. 1C is a schematic illustration of a master PCB in which embodiments of the present invention can be practiced.

V. DETAILED DESCRIPTION OF THE EMBODIMENTS

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility. Circuitry, methods, and devices configured to prevent day burner failures in luminaires are described in detail below, according to several non-limiting exemplary embodiments.

Embodiments of the present invention provide PCB assemblies configured to be sliced at predefined locations using traditional slicing techniques, such as V-cuts, while enabling electrical connections between various PCB sections, prior to the slicing. In the embodiments, instead of using complex materials or methods of cutting through electrical connections, the connection is made with a simple SMT jumper, such as a resistor, above the V-cut, when the sections are staying together.

FIG. 1A is a schematic illustration of a conventional four panel master PCB 100 constructed using traditional panelization techniques. By way of background, panelization is a procedure where a number of PCBs (e.g., PCB sections) are grouped together for manufacturing onto a larger master PCB. During depaneling, the master PCB is separated into individual (final) PCBs. In FIG. 1A, the final PCBs are numbered 1-4. FIG. 1B, for example, is a schematic illustration of a second conventional master PCB 102. The master PCB 102 is configured to be separated into six final PCBs Separating the individual PCBs is typically accomplished by cutting or breaking perforations along the boundaries of individual circuits, similar to sheets of postage stamps. Another method, discussed above, that consumes less PCB real estate, is to cut V-shaped grooves across the full dimension of the panel. The individual PCBs can then be broken apart along these grooves. FIG. 1C is a schematic illustration of a master PCB 104 formed using the exemplary V-cut process.

Although the embodiments are illustrated in view of V-cut PCBs, the present invention is not so limited and can be practiced in PCBs using other panelization schemes well known to those of skill in the art.

Figure 2:
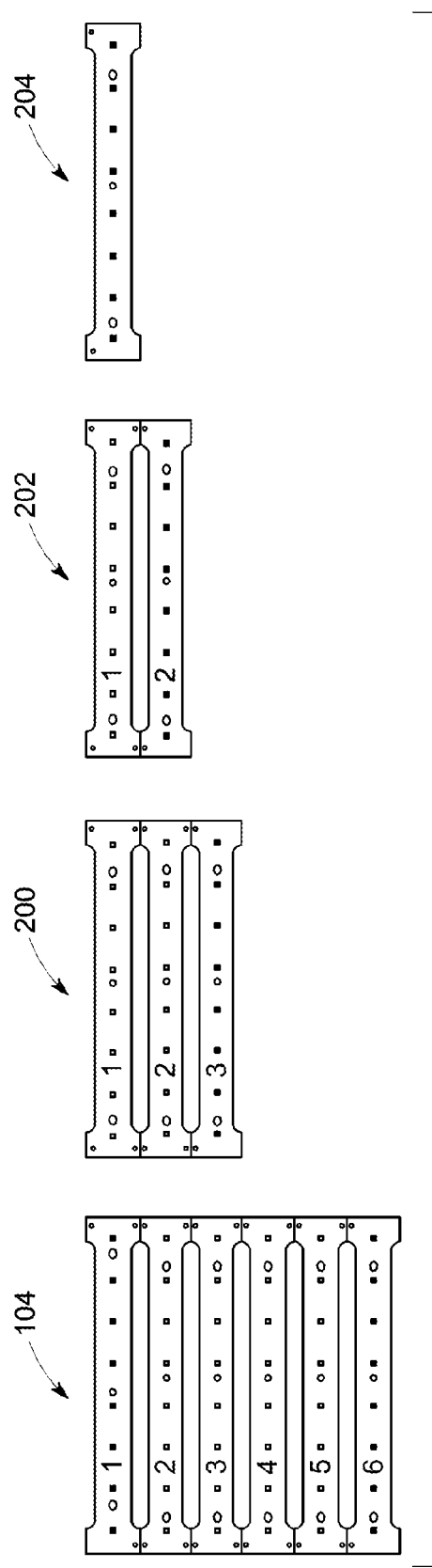
FIG. 2 is a schematic illustration of the master PCB design of FIG. 1C constructed in various modular sizes.

FIG. 2 is a schematic illustration of the master PCB 104 of FIG. 1C separated into various modular sections. For example, the master PCB 104 can be separated into triple PCB arrangement 200 (3-sections), a double PCB arrangement 202 (2-sections), or a single PCB arrangement 204 (1-section). In the exemplary illustration of FIG. 2, the various sections are defined by grooves formed using a V-cut.

Using a depaneling technique, such as the V-cut, a single large printout of the master PCB 104 can be prepared. Depending on customer requirements, and which end-product is actually manufactured, PCB designers can decide whether the triple PCB arrangement 200, the double PCB arrangement 202, or some other PCB arrangement is most suitable to fulfill the end-product and customer requirements. By way of example, if electrical components are being inserted, and it's determined that the double PCB arrangement 202 is the most suitably sized, adjacent sections (1) and (2) of the double PCB arrangement 202 can be electrically connected together, as discussed in greater detail in FIG. 3.

This approach of constructing a single sized master PCB, and multiple PCB sections, then selecting a suitable number of sections in real time, is faster. This approach also provides a cost advantage by eliminating the need for master PCBs of multiple sizes. Further, the single sized master PCB can be ordered or constructed, providing greater cost savings. Subsequently, more suitably sized PCB sections can be formed of the single master PCB when electrical components are inserted.

Figure 3:
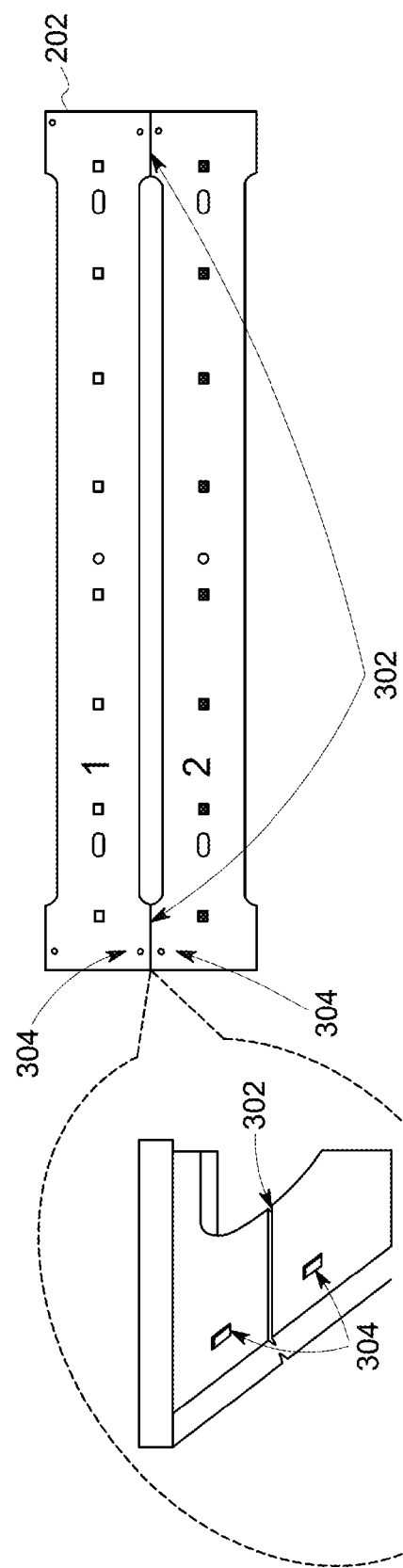
FIG. 3 is a schematic illustration of the exemplary master PCB of FIG. 1C constructed and arranged in accordance with embodiments of the present invention.

FIG. 3 is an illustration of the exemplary double PCB arrangement 202 of FIG. 1C, shown in additional detail, in accordance with the embodiments. In particular, in FIG. 3, the master PCB 104 has been separated into the double arrangement 202, including adjacent sections (1) and (2). The sections (1) and (2) are separated by a V-cut groove 302. Additionally, each of the sections (1) and (2) includes a connection node 304 where pads of a jumper can be inserted for electrically connecting the sections (1) and (2) together.

Figure 4:
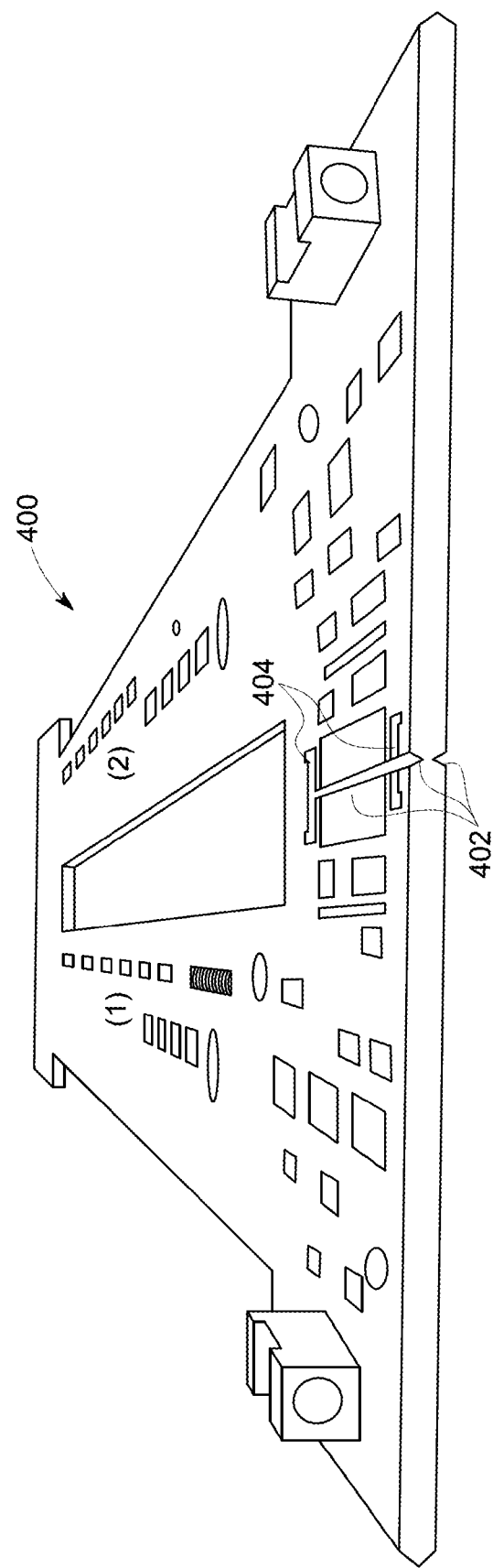
FIG. 4 is an illustration of actual exemplary final PCB panels electrically connected in accordance with the embodiments.

FIG. 4 is a side view illustration of actual exemplary double PCB arrangement 400 with sections (1) and (2) electrically connected in accordance with the embodiments. In FIG. 4, a V-cut groove 402 divides the sections (1) and (2). Jumpers 404 are inserted across the groove 402 to form the electrical connection.

Figure 5:
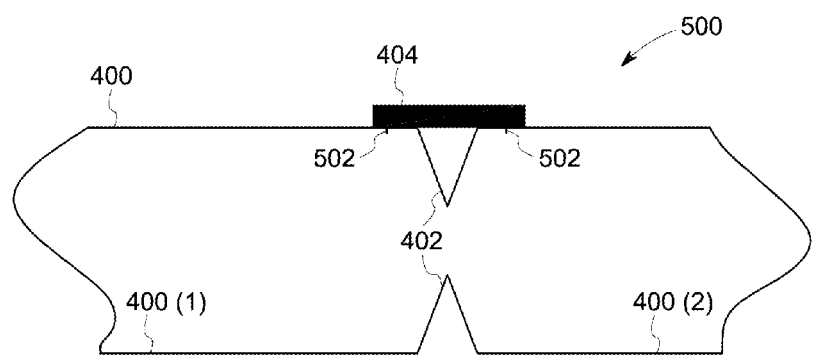
FIG. 5 is an exemplary schematic depiction of in exemplary groove of the final PCB panels illustrated in FIG. 4, in accordance with the embodiments.

FIG. 5 is a detailed schematic illustration 500 of the V-cut groove 402 (see FIG. 4) separating the sections (1) and (2) of the double PCB arrangement 400. In FIG. 5, the jumper 404 is attached across the groove 402. Pads (e.g., legs) 502 of the jumper 404, that provide the electrical connectivity of the jumper 404, are inserted into connection nodes of each of the adjacent sections (1) and (2), such as the nodes 304 of FIG. 3.

Figure 6:
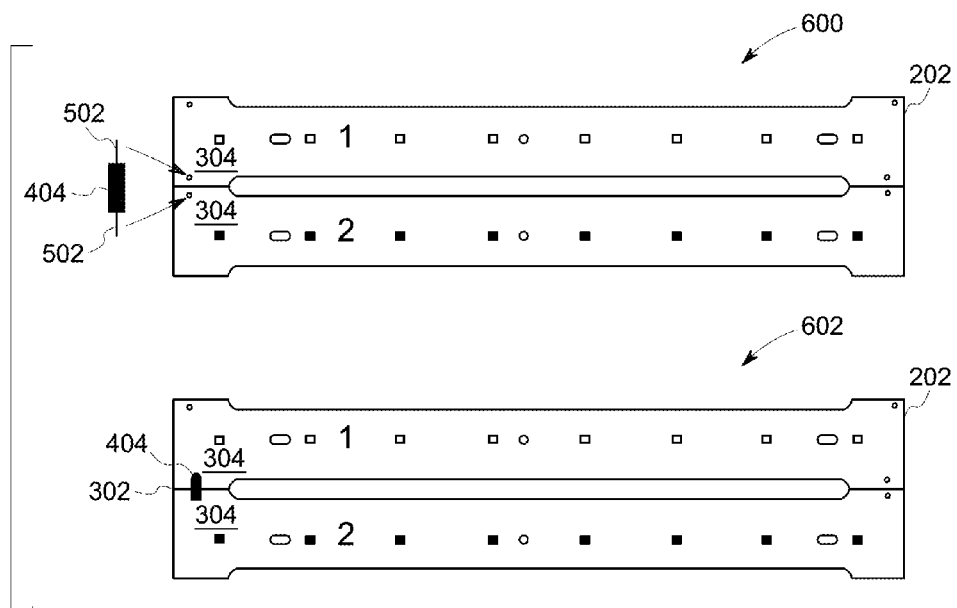
FIG. 6 is an exemplary illustration of final PCB sections configured for connection via a jumper in accordance with the embodiments.

FIG. 6 is an exemplary illustration of mechanical aspects of electrically connecting the adjacent sections (1) and (2) of the double PCB arrangement 202, in accordance with the embodiments. In FIG. 6, in a stage-A process 600, the double PCB arrangement 202 is configured for insertion of the jumper 404, as depicted in FIG. 5.

In the stage-A 600, the connection pads 502 of the jumper 404 are configured for insertion into connection nodes 304, respectively. In FIG. 6, in a stage-B process 602, the jumper 404 is shown fully installed across the V-cut groove 302, with the connection pads 502 fully inserted into the connection nodes 304. While FIG. 6 focuses on the mechanical aspects of electrically connecting adjacent PCB sections, FIG. 7 provides an illustration of electrical aspects.

Figure 7:
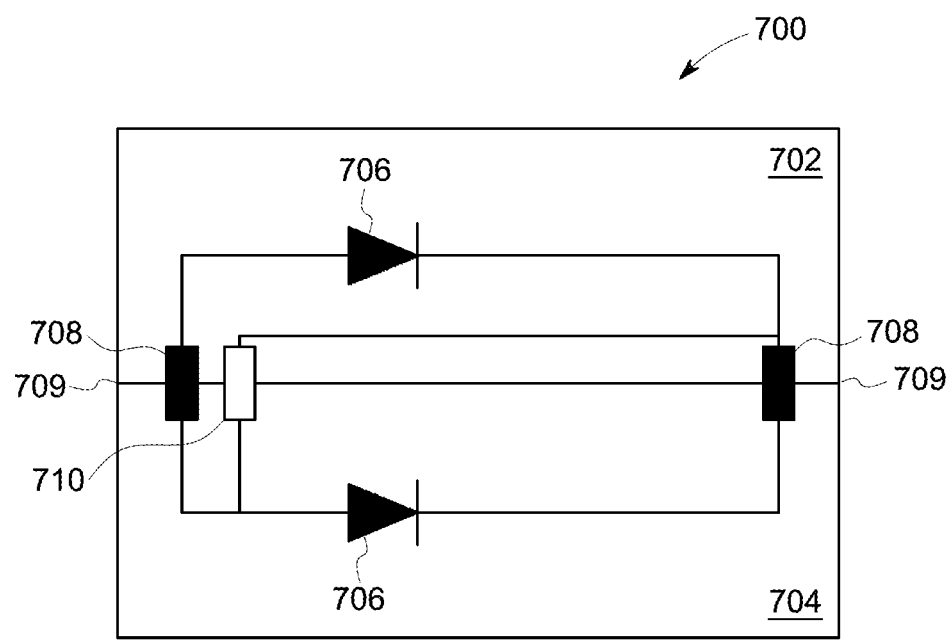
FIG. 7 is an illustration of an exemplary schematic diagram of electrical connections between single components on final PCB sections, in accordance with the embodiments.

FIG. 7 is an illustration of an exemplary schematic diagram 700 of electrical connections between single components on adjacent PCB sections 702 and 704, in accordance with the embodiments. In FIG. 7, each of the PCB sections 702 and 704 include a diode 706 inserted thereon, forming a printed circuit assembly. Jumpers 708 are used and inserted across groove 709, at respective ends of the PCB sections 702 and 704.

By using two jumpers 708, connected at respective ends of the PCB sections 702 and 704, a parallel electrical connection is formed between the PCB sections 702 and 704. Using a single jumper 710, however, enables formation of a series connection between the PCB sections 702 and 704. Thus, using a single jumper 710 at one location, or two jumpers 708 at respective ends of the PCB sections 702 and 704, determines whether the connection will be serial or parallel.

Figure 8:
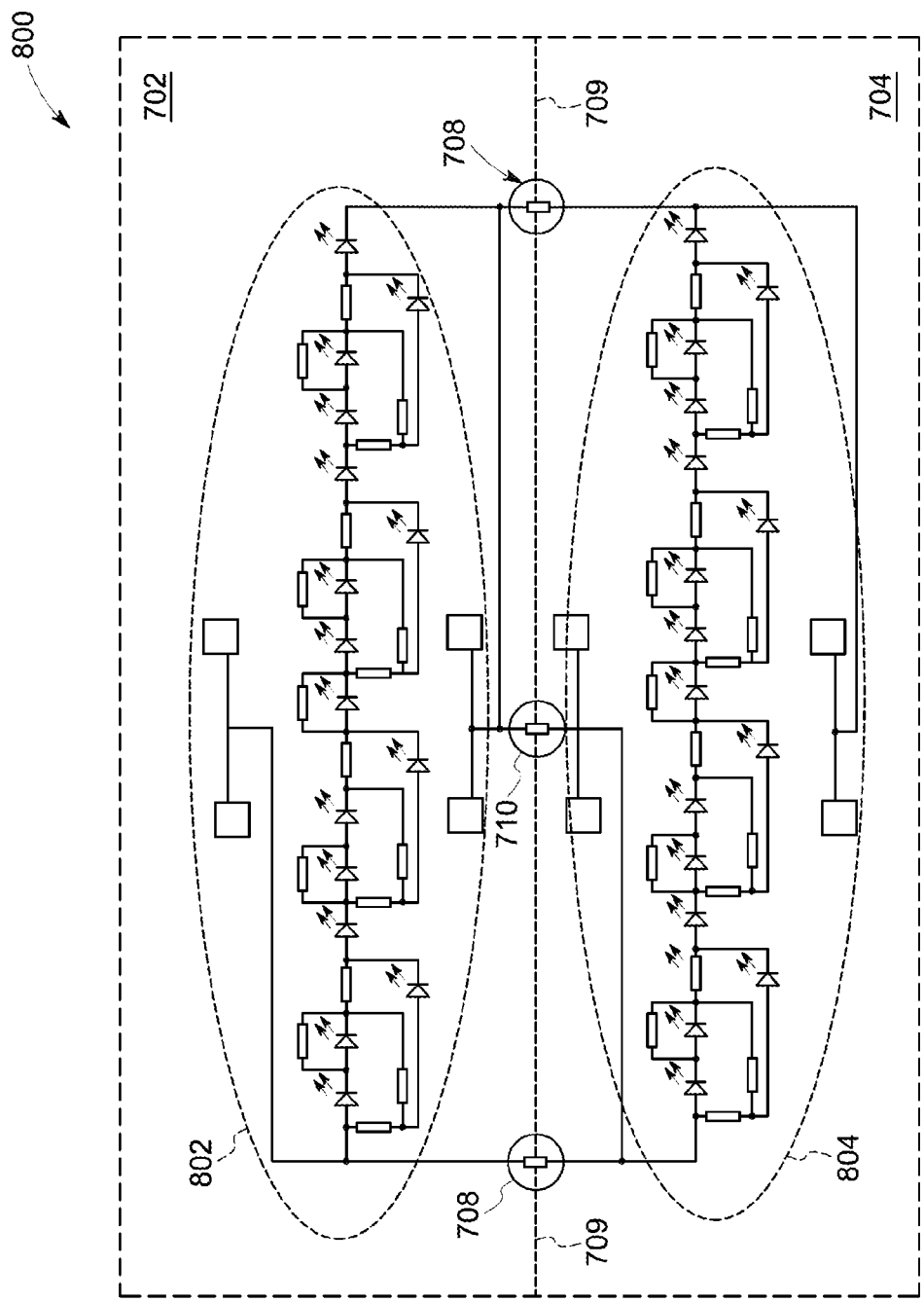
FIG. 8 is an illustration of an exemplary schematic diagram of electrical connections between multiple components on final PCB sections, in accordance with the embodiments.

FIG. 8 is a more detailed illustration of an exemplary schematic diagram 800 of electrical connections between multiple components of the PCB sections 702 and 704, in accordance with the embodiments. In FIG. 8, the jumpers 708 are connected at respective ends of the PCB sections 702 and 704 to form a parallel connection between the PCB sections across the groove 709. Thus, the PCB sections 702 and 704 are connected in parallel to energize respective electrical components 802 and 804.

Alternatively, the single jumper 710 can be used to connect the PCB sections 702 and 704 in series to energize the respective electrical components 802 and 804. The choice between the jumpers 708 and the jumpers 710 can be easily accomplished via a user through software, for example, via a pick and place programming file change. For purposes of illustration, and not limitation, the exemplary jumper 708 and 710 are resistors. The present invention, however, is not limited to jumpers formed of resistors.

For example, any 2-pad SMT electrical component can be used to electrically connect PCB sections across the groove. Many other 2-pad electrical components such as an LED, a capacitor, an inductor, etc. are suitable to form the electrical connection. In other embodiments, other approaches, such as a board-to-board side clip with electrical contacts, or any other suitable electrical connection mechanism, can be used to form the electrical connections. In yet additional embodiments, through-hole resistors or soldered wire can be used to form the electrical connection between adjacent sections of a master PCB.

Those skilled in the relevant art(s) will appreciate that various adaptations and modifications of the embodiments described above can be configured without departing from the scope and spirit of the disclosure. Therefore, it is to be understood that, within the scope of the appended clauses, the disclosure may be practiced other than as specifically described herein.

What is claimed is:

1. A master printed circuit board (PCB), comprising:
PCB sections defined by grooves cut in the master PCB, the grooves separating one section from another;
wherein a final PCB is formable via use of one or more jumpers; and
wherein the one or more jumpers are configured to extend across at least one of the grooves to electrically connect one section to another section, the electrically connected sections forming the final PCB;
wherein each of the one or more jumpers is formed of a two-pad electrical component independently selected from the group consisting of light emitting diode (LED), capacitor, and inductor.

2. The master PCB of claim 1, wherein the one or more jumpers are connected at an assembly level of the final PCB.

3. The master PCB of claim 1, wherein the grooves are formed via V-cuts.

4. The master PCB of claim 1,
wherein the jumpers include pads at respective ends; and
wherein one pad is connected to one panel and the other pad is connected to the other panel.

5. The master PCB of claim 4, wherein the jumpers are formed of an electrical connection mechanism.

6. The master PCB of claim 1, wherein the PCB sections are adjacent to one another.

7. The master PCB of claim 1, wherein the one or more jumpers are configured to extend across at least one of the grooves to electrically connect, in parallel, one section to another section.

8. A printed circuit board (PCB), comprising:
at least two PCB sections defined by a cut line in a larger PCB array, wherein the PCB sections are configured for being electrically connected;
wherein the at least two PCB sections are electrically connectable in parallel via at least one jumper, wherein each of the at least one jumper is formed of a two-pad electrical component independently selected from the group consisting of light emitting diode (LED), capacitor, and inductor; and
wherein the at least two PCB sections are configured to be electrically connected when the at least one jumper is inserted to extend across the cut line to connect one of the PCB sections to the other PCB section.

9. The PCB of claim 8, wherein the at least two PCB sections are adjacent to one another.

10. The PCB of claim 9, wherein the jumper includes at least two pads.

11. The PCB of claim 10, wherein the pads are configured being respectively inserted into connection nodes of the adjacent PCB sections.

12. The PCB of claim 8, wherein the cuts resemble V-shaped grooves.

13. A printed circuit board (PCB), comprising:
at least two PCB sections defined by a cut line in a larger PCB array, wherein the at least two PCB sections are configured for being electrically connected and not separated from each other;
wherein the at least two PCB sections are electrically connectable in parallel via at least one jumper, wherein each of the at least one jumper is formed of a two-pad electrical component independently selected from the group consisting of light emitting diode (LED), capacitor, and inductor; and
wherein the at least two PCB sections are configured to be electrically connected when the at least one jumper is inserted to extend across the cut line to connect one of the PCB sections to the other PCB section.

* * * * *